(12) United States Patent
Tanaka et al.

(10) Patent No.: US 6,521,358 B1
(45) Date of Patent: Feb. 18, 2003

(54) LEAD FRAME FOR SEMICONDUCTOR DEVICE AND METHOD OF PRODUCING SAME

(75) Inventors: Hisahiro Tanaka, Fukuoka (JP); Masanori Ikari, Usa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/153,065

(22) Filed: Sep. 15, 1998

Related U.S. Application Data

(63) Continuation-in-part of application No. 09/031,920, filed on Feb. 27, 1998, now abandoned.

(30) Foreign Application Priority Data

Mar. 4, 1997 (JP) ............................................. 9-048662
Feb. 27, 1998 (JP) ............................................ 10-046939

(51) Int. Cl.⁷ ............................................. B32B 15/00
(52) U.S. Cl. .................... 428/670; 428/675; 428/929; 257/666; 257/677
(58) Field of Search ................. 428/670, 675, 428/929; 257/677, 666

(56) References Cited

U.S. PATENT DOCUMENTS

| | | | | |
|---|---|---|---|---|
| 4,242,180 A | * | 12/1980 | Heppner et al. | |
| 4,529,667 A | * | 7/1985 | Shiga et al. | |
| 5,436,082 A | * | 7/1995 | Mathew | |
| 5,486,721 A | * | 1/1996 | Herklotz et al. | |
| 5,510,197 A | * | 4/1996 | Takahashi et al. | |
| 5,521,432 A | * | 5/1996 | Tsuji et al. | |
| 5,675,177 A | * | 10/1997 | Abys et al. | |
| 5,767,574 A | * | 6/1998 | Kim et al. | |
| 5,929,511 A | * | 7/1999 | Nakazawa et al. | |
| 5,977,620 A | * | 11/1999 | Kim et al. | |
| 6,017,777 A | * | 1/2000 | Kim et al. | |

FOREIGN PATENT DOCUMENTS

| | | | |
|---|---|---|---|
| JP | 6349382 | | 9/1984 |
| JP | 59168659 A | * | 9/1984 |
| JP | 632358 | | 1/1988 |
| JP | 242753 | | 2/1990 |
| JP | 4115558 | | 4/1992 |
| JP | 5117898 | | 5/1993 |
| JP | 7169901 | | 7/1995 |

* cited by examiner

*Primary Examiner*—Deborah Jones
*Assistant Examiner*—Jennifer McNeil
(74) *Attorney, Agent, or Firm*—Stevens, Davis, Miller & Mosher, LLP

(57) ABSTRACT

A lead frame for a semiconductor device includes a sheet-like body and a Pd coating plated on the sheet-like body. The Pd coating includes Ni in an amount of not more than 2%. In another embodiment, the Pd coating includes Cu in an amount of not more than 0.12%. By virtue of limiting the amount of Ni or Cu to these particular levels, the solderability of the lead frame is remarkably enhanced.

13 Claims, 4 Drawing Sheets

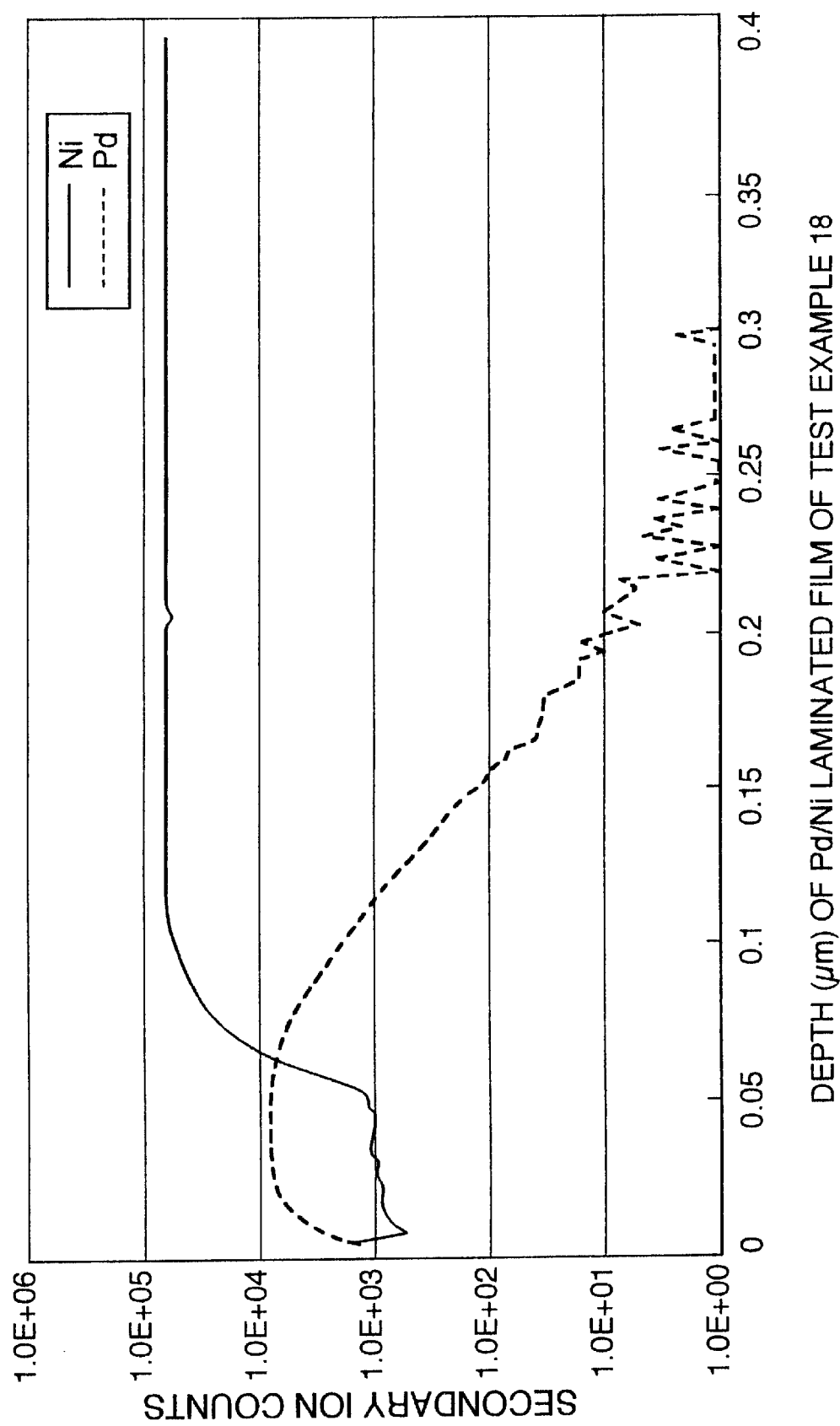

LEAD FRAME FOR SEMICONDUCTOR DEVICE AND METHOD OF PRODUCING SAME

CROSS-REFERENCE TO RELATED APPLICATION

This application is a continuation-in-part application of U.S. application Ser. No. 09/031920 filed on Feb. 27, 1998, abandoned.

BACKGROUND OF THE INVENTION

This invention relates to a lead frame for a semiconductor device and also to a method of producing such a lead frame.

FIG. 3 is a plan view showing ordinary-type semiconductor device lead frames for mounting a semiconductor device, such as a transistor and an IC, thereon, and FIG. 4 is a view showing a condition in which the semiconductor device is mounted on the lead frame. In FIGS. 3 and 4, reference numeral 4 denotes a pad portion, reference numeral 5 an inner lead portion, reference numeral 6 an outer lead portion, reference numeral 7 a tie-bar portion, reference numeral 8 a semiconductor chip (semiconductor device), reference numeral 9 an adhesive, reference numeral 10 an electrode pad, reference numeral 11 a wire, and reference numeral 12 a sealing resin.

The design and characteristics of the semiconductor device lead frame of the above construction will now be described.

In FIG. 3, the plurality of inner lead portions 5 are provided around the pad portion 4 (for mounting the semiconductor chip 8 thereon) in spaced relation thereto, and the inner lead portions 5 are connected respectively to the outer lead portions 6 through the tie-bar portion 7. The semiconductor device lead frame, having a configuration as shown in FIG. 3, can be obtained by pressing or etching a plate-like stock made of Cu alloy or Fe—Ni alloy. In order to prevent the oxidation of the pad portion 4 and the inner lead portions 5, these portions are partially plated with precious metal, such as Ag, to have a plating film with a thickness of 3 to 5 μm.

Generally, the semiconductor chip 8 is mounted on such a semiconductor device lead frame, using the following process. As shown in FIG. 4, the semiconductor chip 8 is die-bonded to the pad portion 4 by the adhesive 9, and the electrode pads 10, formed beforehand on the semiconductor chip 8, are wire-bonded to the respective inner lead portions 5 by the wires 11 made of Au, Al or Cu, thus creating an electrical connection therebetween.

Thereafter, a predetermined portion of the lead frame, including the wire-bonded portions, is sealed by the sealing resin 12 such as an epoxy resin. Then, solder, such as Sn—Pb alloy, is plated onto the outer lead portions 6, thereby imparting solderability thereto, and the tie-bar portions 7 are cut off, and then a deburring process is effected, and then the outer lead portions 6 are bent, hereby completing the resin-sealed semiconductor device. The resin-sealed semiconductor device thus produced is mounted on a board (such as a printed circuit board) of an external equipment, and the relevant wiring on this board is connected by soldering to the outer lead portions 6, thereby forming an intended electronic equipment circuit.

Incidentally, the plating treatment for the outer lead portions 6 is usually effected using a hot dipping method or an electroplating method. However, in the hot dipping method, the high-temperature (230 to 400° C.) treatment is effected, and therefore the resin-sealed semiconductor device undergoes a high thermal stress, so that fine gaps are sometimes caused between the sealing resin 12 and the lead frame, thereby lowering the reliability of the resin-sealed semiconductor device. In the case of the electroplating method, a plating solution is usually acid or alkali, and therefore part of the sealing resin 12 is sometimes corroded, so that the plating solution intrudes into the sealing resin 12, and as a result the wires 11 and the electrode pads 10 are subjected to corrosion, thereby lowering the reliability of the resin-sealed semiconductor device.

In view of the fact that the reliability of the resin-sealed semiconductor device is thus lowered, there has recently been used a solder PPF (Pre-Plated Frame) method in which solder, such as Sn—Pb alloy, is applied beforehand onto the outer lead portions 6, and thereafter the semiconductor chip is mounted on the lead frame. However, when this solder PPF method is used, it is necessary to effect the wire bonding operation (which is the later step) at sufficiently low temperatures so that the Sn—Pb alloy will not be melted by heat produced during this wire bonding operation. And besides, where the plate-like stock is a Cu material, the thermal diffusion of ions of impurities, contained in this Cu material, into the Sn—Pb alloy lowers the solderability of the outer lead portions 6, and therefore this must be taken into consideration.

Therefore, recently, there have been proposed a lead frame (see Japanese Patent Examined Publication No. 63-49382 and Japanese Patent Unexamined Publication No. 63-2358) in which a Pd coating or a Pd alloy coating is formed on the pad portion 4, the inner lead portions 5 and the outer lead portions 6, a corrosion-resistant lead frame (see Japanese Patent Unexamined Publication No. 2-42753) in which an intermediate layer is formed between a Pd coating and a plate-like stock, thereby reducing the galvanic migration, a lead frame (see Japanese Patent Unexamined Publication No. 4-115558) in which a thin plating film of Au or Ag is formed on a coating of Pd or Pd alloy, thereby enhancing the solder wettability, a lead frame (see Japanese Patent Unexamined Publication No. 5-117898) in which a primary coat, composed, for example, of Ni, Zn or Sn, is formed between a coating of precious metal (e.g. Pd) and a plate-like stock, thereby preventing cracks from developing during a bending operation, and a lead frame (see Japanese Patent Unexamined Publication No. 7-169901) in which a Ni layer, a Pd layer and an Au layer are sequentially formed in a laminated manner on a plate-like stock, and this Pd layer has a multi-layer construction.

A Pd coating, or a Pd alloy coating is a precious metal like Ag and Au, and therefore is chemically stable, and is less liable to oxidize, and is hardly affected by the thermal diffusion from the lead frame body. Therefore, the Pd coating or the Pd alloy coating achieves the good bonding of the semiconductor chip 8 and the good wire bonding properties solder wettability the and of the outer lead portions 6 is good. Furthermore, since the Pd coating or the Pd alloy coating is formed on the lead frame over the entire surface thereof, advantages that are achieved include that the process can be simplified and that the quality of the products is stable.

However, the above conventional semiconductor device lead frames have the following problems.

Recently, the requirements for the characteristics of semiconductor devices have become more severe year after year, and although the Pd coating or the Pd alloy coating is chemically stable, and has the wire bonding properties of an almost acceptable level as described above, it sometimes fails to fully satisfy these stringent requirements. For example, although particular problem is not encountered with the bonding of the semiconductor chip 8 and the wire bonding properties, the Pd coating or the Pd alloy coating on the outer lead portions 6 is oxidized by a high-temperature thermal stress, occurring during the bonding of the semiconductor chip 8, though this coating is precious metal, and as a result the solder wettability at the later step is lowered, thus affecting the solderability. Specifically, it becomes difficult to cover the required solder-wetting area, and the wetting rate decreases, and therefore the time of dipping in a soldering bath increases, thus lowering the efficiency of the operation, and in the worse case, there have been instances in which the solder wetting has not taken place at all. Particularly, with a high-density design of recent semiconductor devices, the space between the adjacent outer lead portions 6 becomes narrower, and at the time of the reflow bonding by cream solder during the mounting of the semiconductor device on the board, the cream solder flows along the surface of the board because of the poor solder wettability, which results in a problem that bridges are caused between the wires, so that the circuit is short-circuited. Although the occurrence of such bridges can be reduced to a certain degree by reducing the amount of coating of the cream solder, this invites another problem. Namely, as a result of the reduced amount of coating of the cream solder, the height of coating of the cream solder is reduced, and in some cases, the outer lead portions 6 cannot be bonded to the board of the external equipment at all because of variations in the gap between the outer lead portions 6 and the board, which results in the problem of the circuit of the electronic equipment being kept open.

In this semiconductor device lead frame and the method of producing this lead frame, it is required to prevent the solder wettability of the Pd coating or the Pd alloy coating, formed on the plate-like stock, from being lowered.

SUMMARY OF THE INVENTION

It is an object of this invention to provide a lead frame for a semiconductor device in which the solder wettability of a Pd coating or a Pd alloy coating formed on a sheet-like body is prevented from being lowered.

Another object of the invention to provide a method of producing a lead frame for a semiconductor device in which the solder wettability of a Pd coating or a Pd alloy coating formed on a sheet-like body is prevented from being lowered.

According to one aspect of the present invention, there is provided a lead frame for a semiconductor device in which a Pd coating or a Pd alloy coating is formed on a sheet-like body, and the amount of impurity metal (e.g. Ni) other than Pd or Pd alloy constituents, which impurity metal is contained in the Pd coating or in the Pd alloy coating, is not more than 10 ppm.

With this construction, there is obtained the semiconductor device lead frame in which the solder wettability of the Pd coating or the Pd alloy coating, formed on the sheet-like body, is prevented from being lowered.

According to another aspect of the invention, there is provided a method of producing a lead frame for a semiconductor device in which a Pd coating is formed on a sheet-like body by Pd plating, or a Pd alloy coating is formed on the sheet-like body by Pd alloy plating, and the amount of impurity metal (e.g. Ni) other than Pd or Pd alloy constituents, which impurity metal is contained in a Pd plating solution or in a Pd alloy plating solution, is not more than 10 ppm.

BRIEF DESCRIPTION OF THE DRAWINGS

FIG. 6 is a graph showing a relation between a Pd intensity, a Ni intensity and a depth of the coating of Test Example 18 in Table 3.

DESCRIPTION OF THE PREFERRED EMBODIMENTS

Figure 1:
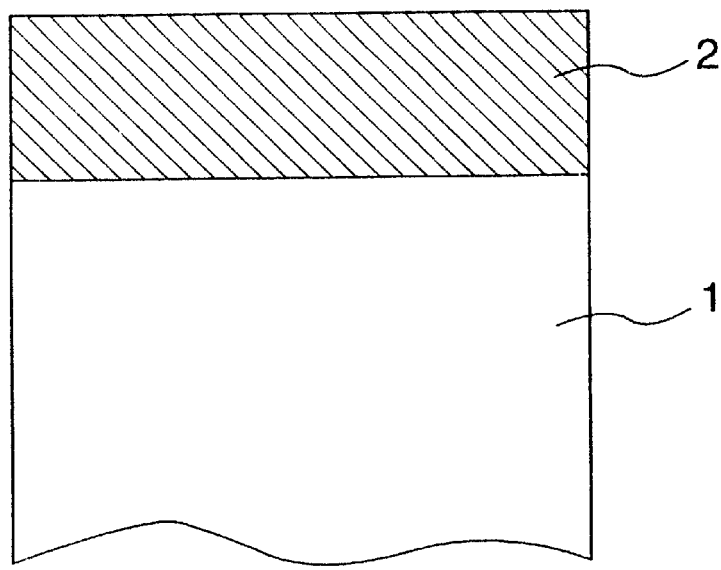
FIG. 1 is a schematic cross-sectional view showing a first embodiment of a lead frame of the invention for a semiconductor device.

According to a 1st aspect of the present invention, there is provided a lead frame for a semiconductor device comprises a plate-like stock (that is, sheet-like body), and one of a Pd coating and a Pd alloy coating formed on the plate-like stock, wherein the amount of impurity metal other than Pd or Pd alloy constituents, which impurity metal is contained in the Pd coating or in the Pd alloy coating, is not more than 2%. The amount of the impurity metal (which forms an oxide because of a high-temperature thermal stress occurring during the bonding of the semiconductor device (e.g. a semiconductor chip)) in the coating is reduced to a low level, thereby preventing the solder wettability of the Pd coating or the Pd alloy coating from being lowered.

According to a 2nd aspect of the invention, there is provided a lead frame for a semiconductor device comprising a plate-like stock, and one of a Pd coating and a Pd alloy coating formed on the plate-like stock through a primary coat, wherein the amount of impurity metal other than Pd or Pd alloy constituents, which impurity metal is contained in the Pd coating or in the Pd alloy coating, is not more than 2%. The amount of the impurity metal (which forms an oxide because of a high-temperature thermal stress occurring during the bonding of the semiconductor device) in the coating is reduced to a low level, thereby preventing the solder wettability of the Pd coating or the Pd alloy coating from being lowered.

According to a 3rd aspect of the invention depending on the 2nd aspect, the primary coat is made to be a Ni coating, so that the oxidation of the stock is prevented, and this achieves an advantageous effect that the lowering of the solder wettability of the Pd coating or Pd alloy coating is prevented.

According to a 4th aspect of the invention, there is provided a lead frame for a semiconductor device comprising a plate-like stock, and one of a Pd coating and a Pd alloy coating formed on the plate-like stock, wherein the amount of impurity metal other than Pd or Pd alloy constituent, which impurity metal is contained in the Pd coating or in the Pd alloy coating, is not more than 1%. The amount of the impurity metal (which forms an oxide because of a high-temperature thermal stress occurring during the bonding of the semiconductor device) present in the coating is reduced to a lower level, thereby more positively preventing the solder wettability of the Pd coating or the Pd alloy coating from being lowered.

According to a 5th aspect of the invention, there is provided a lead frame for a semiconductor device comprising a plate-like stock, and one of a Pd coating and a Pd alloy coating formed on the plate-like stock through a primary coat, wherein the amount of impurity metal other than Pd or Pd alloy constituents, which impurity metal is contained in the Pd coating or in the Pd alloy coating, is not more than 1%. The amount of the impurity metal (which forms an oxide because of a high-temperature thermal stress occurring during the bonding of the semiconductor device) present in the coating is reduced to a lower level, thereby more positively preventing the solder wettability of the Pd coating or the Pd alloy coating from being lowered.

According to a 6th aspect of the invention depending on the 5th aspect, the primary coat is made to be a Ni coating, so that the oxidation of the stock is prevented, and this achieves an advantageous effect that the lowering of the solder wettability of the Pd coating or the Pd alloy coating is prevented.

According to a 7th aspect of the invention, there is provided a lead frame for a semiconductor device wherein a Pd coating or a Pd alloy coating is formed on a plate-like stock, wherein the amount of impurity metal other than Pd or Pd alloy constituents, which impurity metal is contained in the Pd or the Pd alloy coating, is not more than 0.12%. The amount of the impurity metal (which forms an oxide because of a high-temperature thermal stress occurring during the bonding of the semiconductor device) present in the coating is reduced to a lower level, thereby more positively preventing the solder wettability of the Pd coating or the Pd alloy coating from being lowered.

According to an 8th aspect of the invention, there is provided a lead frame for a semiconductor device wherein a Pd coating or a Pd alloy coating is formed on a plate-like stock through a primary coat, wherein the amount of impurity metal other than Pd or Pd alloy constituents, which impurity metal is contained in the Pd or Pd alloy coating, is not more than 0.12%. The amount of the impurity metal (which forms an oxide because of a high-temperature thermal stress occurring during the bonding of the semiconductor device) present in the coating is reduced to a lower level, thereby more positively preventing the solder wettability of the Pd coating or the Pd alloy coating from being lowered.

According to a 9th aspect of the invention depending on the 8th aspect, the primary coat is made to be a Ni coating, so that the oxidation of the stock is prevented, and this achieves an advantageous effect in that the lowering of the solder wettability of the Pd coating or the Pd alloy coating is prevented.

According to a 10th aspect of the invention, there is provided a lead frame for a semiconductor device wherein a Pd coating or a Pd alloy coating is formed on a plate-like stock, wherein the amount of impurity metal other than Pd or Pd alloy constituents, which impurity metal is contained in the Pd or the Pd alloy coating, is not more than 0.06%. The amount of the impurity metal (which forms an oxide because of a high-temperature thermal stress occurring during the bonding of the semiconductor device) present in the coating is reduced to a lower level, thereby more positively preventing the solder wettability of the Pd coating or the Pd alloy coating from being lowered.

According to an 11th aspect of the invention, there is provided a lead frame for a semiconductor device wherein a Pd coating or a Pd alloy coating is formed on a plate-like stock through a primary coat, wherein the amount of impurity metal other than Pd or Pd alloy constituents, which impurity metal is contained in the Pd or Pd alloy coating, is not more than 0.06%. The amount of the impurity metal (which forms an oxide because of a high-temperature thermal stress occurring during the bonding of the semiconductor device) present in the coating is reduced to a lower level, thereby more positively preventing the solder wettability of the Pd coating or the Pd alloy coating from being lowered.

According to a 12th aspect of the invention depending on the 11th aspect, the primary coat is made to be a Ni coating, so that the oxidation of the stock is prevented, and this achieves an advantageous effect in that the lowering of the solder wettability of the Pd coating or the Pd alloy coating is prevented.

According to a 13th aspect of the invention, there is provided a method of producing a lead frame for a semiconductor device wherein a Pd or Pd alloy coating is formed on a plate-like stock by Pd or Pd alloy plating, wherein the amount of impurity metal other than Pd or Pd alloy constituents, which impurity metal is contained in a Pd plating solution or in a Pd alloy plating solution, is not more than 200 ppm. The content of the impurity metal in the plating solution is reduced to a lower level, thereby more positively preventing the solder wettability of the Pd coating or the Pd alloy coating from being lowered.

According to a 14th aspect of the invention, there is provided a method of producing a lead frame for a semiconductor device wherein a Pd or Pd alloy coating is formed on a plate-like stock through a primary coat by Pd or Pd alloy plating, wherein the amount of impurity metal other than Pd or Pd alloy constituents, which impurity metal is contained in a Pd plating solution or in a Pd alloy plating solution, is not more than 200 ppm. The content of the impurity metal in the plating solution is reduced to a lower level, thereby more positively preventing the solder wettability of the Pd coating or the Pd alloy coating from being lowered.

According to a 15th aspect of the invention depending on the 14th or the 10th aspect, the primary coat is a Ni coating. Therefore, the oxidation of the stock is prevented, and this achieves an advantageous effect in that the lowering of the solder wettability of the Pd coating or the Pd alloy coating is prevented.

According to a 16th aspect of the invention, there is provided a method of producing a lead frame for a semiconductor device wherein a Pd or Pd alloy coating is formed on a plate-like stock by Pd or Pd alloy plating, wherein the amount of impurity metal other than Pd or Pd alloy constituents, which impurity metal is contained in a Pd plating solution or in a Pd alloy plating solution, is not more than 100 ppm. The content of the impurity metal in the plating solution is reduced to a lower level, thereby more positively preventing the solder wettability of the Pd coating or the Pd alloy coating from being lowered.

According to a 17th aspect of the invention, there is provided a method of producing a lead frame for a semiconductor device wherein a Pd or Pd alloy coating is formed on a plate-like stock through a primary coat by Pd or Pd alloy plating, wherein the amount of impurity metal other than Pd or Pd alloy constituents, which impurity metal is contained in a Pd plating solution or in a Pd alloy plating solution, is not more than 100 ppm. The content of the impurity metal in the plating solution is reduced to a lower level, thereby more positively preventing the solder wettability of the Pd coating or the Pd alloy coating from being lowered.

According to an 18th aspect of the invention depending on the 17th or the 10th aspect, the primary coat is a Ni coating. Therefore, the oxidation of the stock is prevented, and this achieves an advantageous effect that the lowering of the solder wettability of the Pd coating or the Pd alloy coating is prevented.

According to a 19th aspect of the invention, there is provided a method of producing a lead frame for a semiconductor device wherein a Pd or Pd alloy coating is formed on a plate-like stock by Pd or Pd alloy plating, wherein the amount of impurity metal other than Pd or Pd alloy constituents, which impurity metal is contained in a Pd plating solution or in a Pd alloy plating solution, is not more than 10 ppm. The content of the impurity metal in the plating solution is reduced to a lower level, thereby more positively preventing the solder wettability of the Pd coating or the Pd alloy coating from being lowered.

According to a 20th aspect of the invention, there is provided a method of producing a lead frame for a semiconductor device wherein a Pd or Pd alloy coating is formed on a plate-like stock through a primary coat by Pd or Pd alloy plating, wherein the amount of impurity metal other than Pd or Pd alloy constituents, which impurity metal is contained in a Pd plating solution or in a Pd alloy plating solution, is not more than 10 ppm. The content of the impurity metal in the plating solution is reduced to a lower level, thereby more positively preventing the solder wettability of the Pd coating or the Pd alloy coating from being lowered.

According to a 21st aspect of the invention depending on the 20th aspect, the primary coat is a Ni coating. Therefore, the oxidation of the stock is prevented, and this achieves an advantageous effect that the lowering of the solder wettability of the Pd coating or the Pd alloy coating is prevented.

According to a 22nd aspect of the invention, there is provided a method of producing a lead frame for a semiconductor device wherein a Pd or Pd alloy coating is formed on a plate-like stock by Pd or Pd alloy plating, wherein the amount of impurity metal other than Pd or Pd alloy constituents, which impurity metal is contained in a Pd plating solution or in a Pd alloy plating solution, is not more than 5 ppm. The content of the impurity metal in the plating solution is reduced to a lower level, thereby more positively preventing the solder wettability of the Pd coating or the Pd alloy coating from being lowered.

According to a 23rd aspect of the invention, there is provided a method of producing a lead frame for a semiconductor device wherein a Pd or Pd alloy coating is formed on a plate-like stock through a primary coat by Pd or Pd alloy plating, wherein the amount of impurity metal other than Pd or Pd alloy constituents, which impurity metal is contained in a Pd plating solution or in a Pd alloy plating solution, is not more than 5 ppm. The content of the impurity metal in the plating solution is reduced to a lower level, thereby more positively preventing the solder wettability of the Pd coating or the Pd alloy coating from being lowered.

According to an 24th aspect of the invention depending on the 23rd aspect, the primary coat is a Ni coating. Therefore, the oxidation of the stock is prevented, and this achieves an advantageous effect that the lowering of the solder wettability of the Pd coating or the Pd alloy coating is prevented.

First Embodiment

Figure 2:
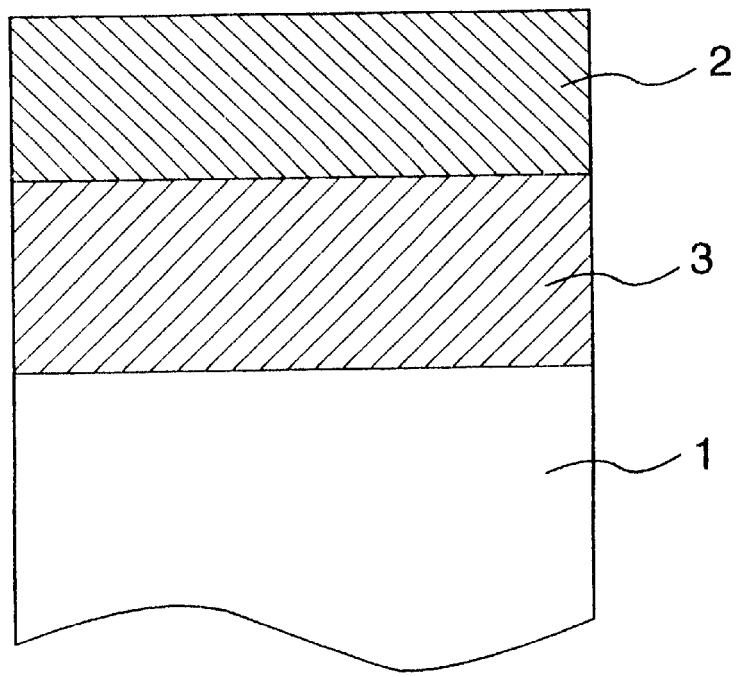
FIG. 2 is a schematic cross-sectional view showing a modified form of the semiconductor device lead frame of FIG. 1.

FIG. 1 is a schematic cross-sectional view showing a first embodiment of a lead frame of the invention for a semiconductor device, and FIG. 2 is a schematic cross-sectional view showing a modified form of the semiconductor device lead frame of FIG. 1. In FIGS. 1 and 2, reference numeral 1 denotes a plate-like stock (that is, sheet-like body) of copper, reference numeral 2 a Pd coating, and reference numeral 3 a Ni primary coat.

A method of producing the semiconductor device lead frame of FIG. 2 will now be described. A method of producing the semiconductor device lead frame of FIG. 1 can be carried out in accordance with the method of producing the semiconductor device lead frame of FIG. 2.

First, the copper stock for the lead frame 1 was subjected to alkali electrolysis degreasing and acid activation by an ordinary method, and then the Ni primary coat 3, having a thickness of 2.0 $\mu$m, was formed on the copper stock 1, and then the Pd plating film (coating) having a thickness of 0.1 $\mu$m was formed on the Ni primary coat 3. The alkali electrolysis degreasing was effected for 15 seconds at a voltage of 5V at a bath temperature of 50° C., using a degreasing solution (NaOH 30 g/l) of NC RASTOL (registered trademark of Okuno Pharmaceutical Corp.), having a concentration of 60 g/l, as an electrolyte, and also using stainless steel as an anode. The acid activation was effected by dipping in a 3% sulfuric acid solution for 15 seconds at a bath temperature of 50° C. The Ni plating was effected at a bath temperature of 50° C. at an average current density of 10 A/dm2, using a sulfamine acid Ni bath. The Pd plating was effected at a bath temperature of 50° C. at an average current density of 6 A/dm2, using a K-PURE PALLADIUM (registered trademark of Kojima Chemical Corp.) bath.

Figure 3:
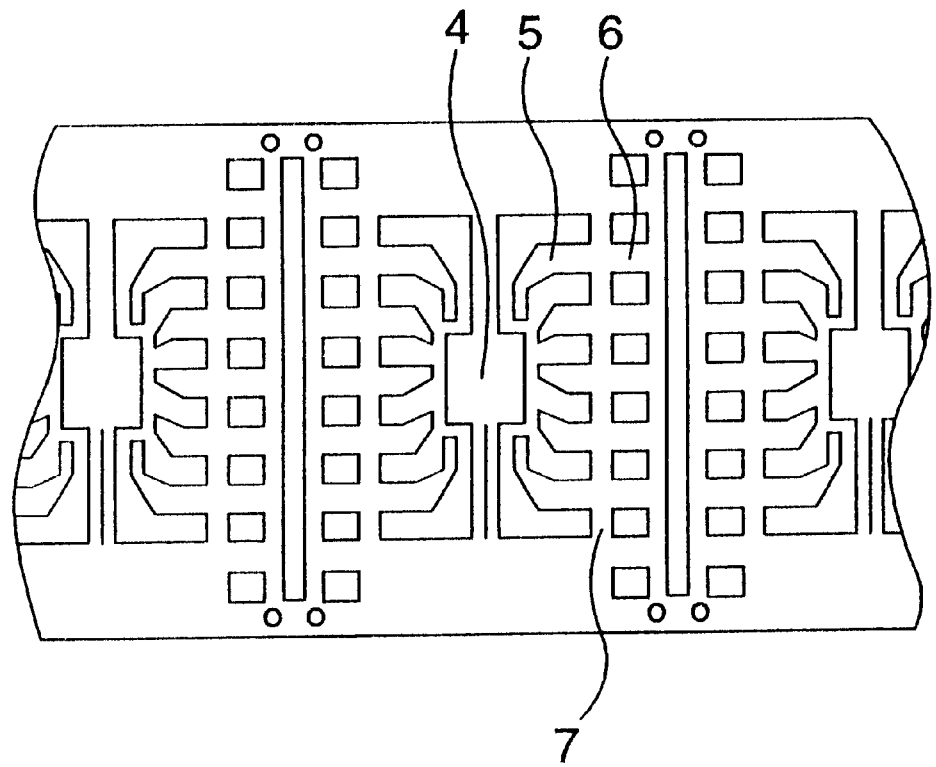
FIG. 3 is a plan view showing ordinary-type semiconductor device lead frames for mounting a semiconductor device, such as a transistor and an IC, thereon.
Figure 4:
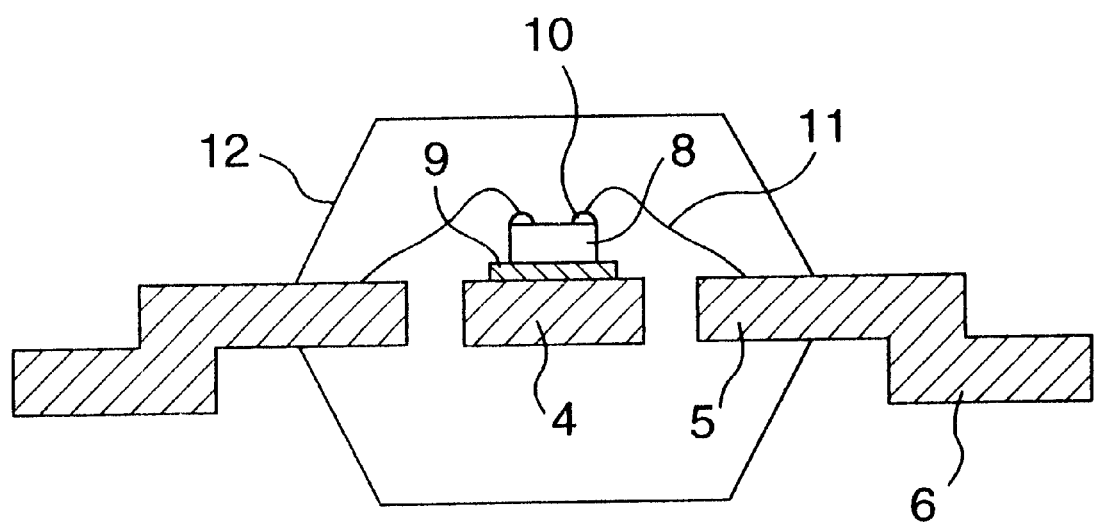
FIG. 4 is a view showing a condition in which the semiconductor device is mounted on the lead frame.

Next, a method of measuring the solderability of the plating film (coating) on the thus prepared semiconductor device lead frames of FIGS. 1 and 2 will be described. First, the plated semiconductor device lead frame was heated for 30 seconds at 315° C. in the atmosphere by a hot plate, and then only outer lead portions 6 (see FIGS. 3 and 4) were cut from the semiconductor device lead frame, and were set in a soldering test device, and a zero cross time was measured by a soldering test method based on a balancing method defined in JIS C 0053. SWET 100, manufactured by Taltin, was used as the soldering test device. With respect to test conditions, the soldering bath temperature was 220° C., the composition of the solder was 60%Sn-40%Pb, the descending speed was 10 mm/sec., ascending speed was 2 mm/sec., and the dipping time was 0.2 sec, and under these conditions the measurement was carried out. Rosin-type R-100 (manufactured by Japan Alpha Metals Corp.) was used as a flux.

These measurement results are shown as Test Example 1 in Table 1. Test Example 1 indicates that when the Ni concentration in the Pd plating solution is 0 ppm, and the Ni concentration in the Pd coating 2 is 0.0 ppm, the solderability is 0.4 sec. at 315° C. The shorter the time, the better the solderability.

TABLE 1

|  | Test Example 1 | Test Example 2 | Test Example 3 | Test Example 4 | Test Example 5 | Test Example 6 | Test Example 7 | Test Example 8 |
|---|---|---|---|---|---|---|---|---|
| Ni concentration in Pd plating liquid (ppm) | 0 | 50 | 100 | 150 | 200 | 300 | 500 | 1000 |
| Ni concentration in Pd coating (%) | 0.00 | 0.52 | 1.06 | 1.55 | 2.02 | 3.11 | 5.05 | 10.32 |
| Solderability (Sec. 315° C.) | 0.4 | 0.4 | 0.4 | 0.6 | 0.9 | 2.2 | 3.7 | 5.0 |

Test Examples 2 to 8 in Table 1 indicate the solderability obtained with the various values of the Ni concentration in the Pd plating solution and the various values of the Ni concentration in the Pd coating 2. Namely, Test Examples 2 to 8 differ from Test Example 1 only in that the Ni plating solution, having been used in the prior step of the process, was added to the Pd plating bath so that the Pd plating solution had the increased Ni concentration shown in Table 1, and other conditions of these Test Examples are the same as those of Test Example 1. The Ni concentration in the Pd coating 2 was measured by a method having the steps of plating it with the predetermined coating of Pt/Ti, dissolving it by nitric acid, and measuring the Ni concentration by using ICP (SPS 7000A manufactured by Seiko Electronic Industry Corp.).

As will be appreciated from Table 1, both the Ni concentration in the Pd plating solution and the Ni concentration in the Pd coating 2 have a constant relation, and the Ni concentration in the Pd plating solution is about the Ni concentration in the Pd coating 2. Namely, in a case of Ni concentration of 50 ppm, the Pd concentration is 10 g/l, so that Ni concentration in Pd becomes 0.52%. In a case where a period of time, required for the soldering, is not more than 1.0 sec., it is thought that sufficient solderability is obtained, and therefore Test Examples 1 to 5 are good as a lead frame for a semiconductor device, while Test Examples 6 and 8 are not good as a semiconductor device lead frame. Namely, it is only necessary that the Ni concentration in the Pd plating solution and the Ni concentration in the Pd coating 2 should be not more than 200 ppm and not more than 2.02%, respectively, and the better solderability is obtained in a case where the Ni concentration in the Pd plating solution and the Ni concentration in the Pd coating are not more than 100 ppm and not more than 1.06%, respectively.

Second Embodiment

Regarding Test Examples 9 to 16 in Table 2, the data of the solderability are shown which were obtained with respect to the various values of the Cu concentration in the Pd plating solution and the various values of the Cu concentration in the Pd coating 2. In Test Examples 10 to 16, the lead frames made of a copper material were in contact with a Pd plating liquid, so that the copper component was dissolved in the Pd plating liquid, and the Cu component in the Pd plating liquid increased by the amounts in Table 2 as a period of time lapsed, the test conditions of Test Examples 10 to 16 differs from those of Test Example 9 only in this respect; in other respects, the test conditions of Test Examples 10 to 16 are the same as those of Test Example 9. The Cu concentrations in Pd coating 2 disclosed in Table 2 were measured by the steps of forming a predetermined coating on Pt/Ti by plating, dissolving it by use of nitric acid, and measuring the Cu concentration by use of ICP (SPS 7000A manufactured by Seiko Electronic Industry Corp.).

TABLE 2

|  | Test Example 9 | Test Example 10 | Test Example 11 | Test Example 12 | Test Example 13 | Test Example 14 | Test Example 15 | Test Example 16 |
|---|---|---|---|---|---|---|---|---|
| Cu concentration in Pd plating liquid (ppm) | 0 | 2 | 5 | 8 | 10 | 12 | 15 | 20 |
| Cu concentration in Pd coating (%) | 0.00 | 0.03 | 0.06 | 0.10 | 0.12 | 0.15 | 0.17 | 0.23 |
| Solderability (Sec. 315° C.) | 0.4 | 0.4 | 0.4 | 0.6 | 0.8 | 3.5 | 5.0 | 5.0 |

As is apparent from Table 2, there is a constant relation between the Cu concentration in the Pd plating liquid and the Cu concentration (Cu content) in the Pd coating 2, and the Cu concentration regarding the Pd concentration in the Pd plating liquid is substantially equivalent to the Cu concentration in the Pd coating 2. Namely, in a case of a Cu concentration of 10 ppm, the Pd concentration is 10 g/l, so that the Cu concentration regarding Pd becomes 0.1%. In a case where a period of time, required for the soldering, is not more than 1.0 sec., it is thought that sufficient solderability is obtained, and therefore Test Examples 9 to 13 are good as a lead frame for a semiconductor device, while Test Examples 14 to 16 are not good as a semiconductor device lead frame. In other words, good solderability is obtained when the Cu concentration in the Pd plating liquid is not more than 10 ppm or when the Cu concentration (Cu amount) in the Pd coating 2 is not more than 0.12%. Particularly, better solderability can be obtained when Cu concentration in the Pd plating liquid is not more than 5 ppm or when Cu concentration (Cu amount) in the Pd coating 2 is not more than 0.06%.

Third Embodiment

Test Examples 17 and 18 were obtained by the steps of forming on a lead frame of a copper material a Ni primary coat by plating in the same manner as in the first embodiment, and forming a Pd plating coating thereon. Regarding the resultant plating coating, analysis in the direction of the depth thereof was performed through secondary ion mass analysis (hereinafter referred to as "SIMS") by use of an analysis device (called "ims-4f" manufactured by CAMECA company). The SIMS is a method in which a sample surface is irradiated with ion beam so that atoms are ejected from the sample surface (i.e., the phenomenon of sputtering) with the particles being ionized and in which the kind and concentration of elements contained in the sample surface are measured by analyzing the ionized particles by use of a mass analyzer. In the SIMS, the count number corresponding to the number of ionized secondary ions designates the amount of atoms or molecules corresponding to the mass number. The condition of the measuring is as follows:

primary ion kind - - - O2+;

secondary ion kind - - - positive ion:

primary ion energy - - - 8.0 keV;

primary ion current - - - 230 nA;

raster area - - - 300 μm×300 μm; and analysis area - - - an area defined by a diameter of 30 μm.

Ni concentration in Pd coating 2 was measured by a method comprising the steps of directly plating a predetermined coating on a lead frame of a copper material without providing a Ni primary coat, dissolving it by nitric acid, and performing the measurement by use of the ICP.

TABLE 3

|  | Test Example 17 | Test Example 18 | Test Example 18/Test Example 17 |
|---|---|---|---|
| Ni concentration in Pd plating liquid (ppm) | 4.7 | 18.2 | 3.87 |
| Ni concentration in Pd coating (%) | 0.06 | 0.22 | 3.67 |

TABLE 3-continued

|  | Test Example 17 | Test Example 18 | Test Example 18/Test Example 17 |
|---|---|---|---|
| Ratio of Ni intensity/Pd intensity | 0.0377 | 0.137 | 3.63 |

Figure 5:
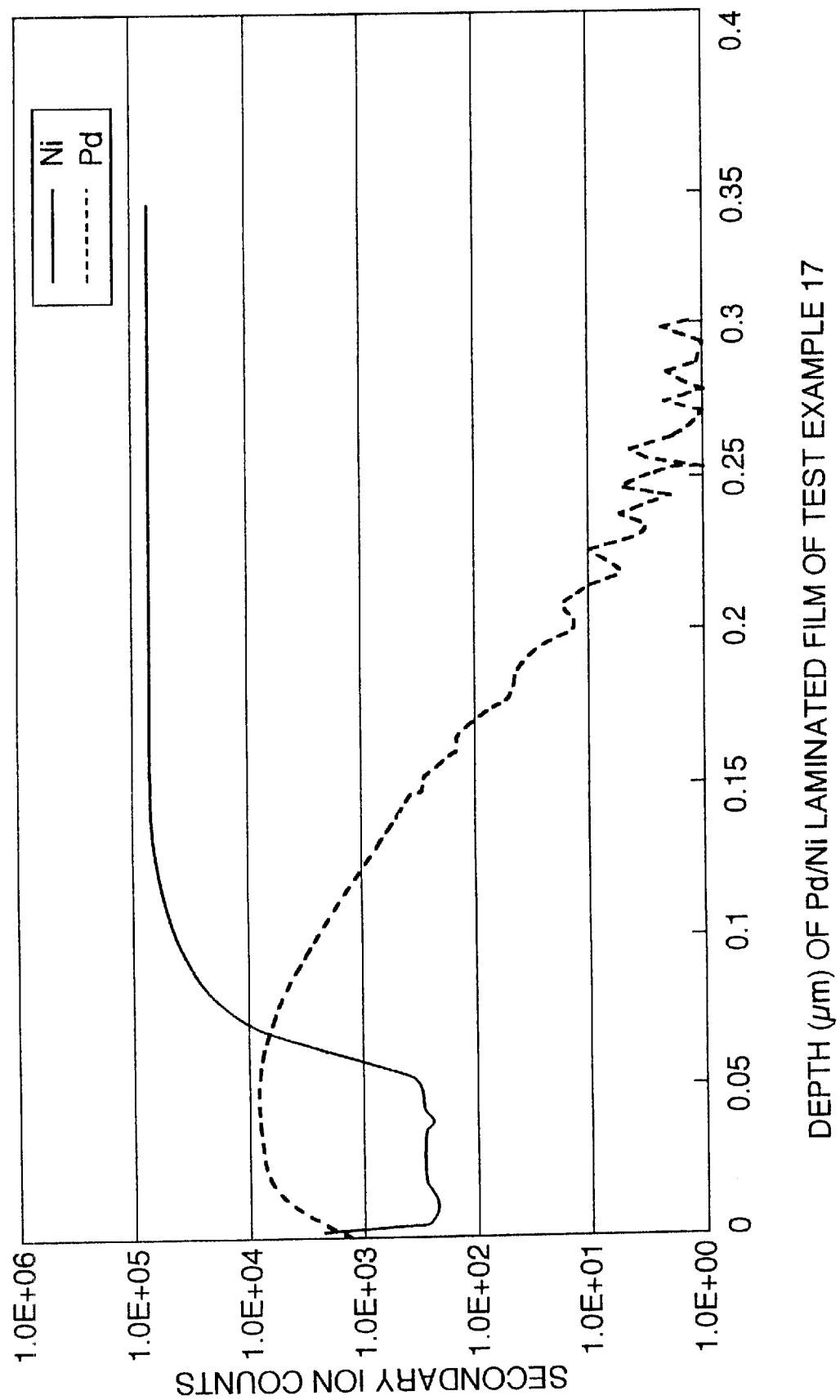
FIG. 5 is a graph showing a relation between a Pd intensity, a Ni intensity and a depth of the coating of Test Example 17 in Table 3.

The intensity ratios of Pd/Ni disclosed in Table 3 were calculated by standardizing Ni intensity through Pd intensity while using the average value of an area (0.03 to 0.05 μm) where the intensity of secondary ions of Pd and Ni is stable in the SIMS chart of FIGS. 5 and 6. As shown in Table 3, in the test examples, the Ni concentration in Pd plating liquid is reflected in the Ni concentration (Ni content) in the Pd coating. It is found from the analysis by use of the SIMS that the intensity rate of Pd/Ni which is the ratio of the test example 17 to the test example 18 corresponds to a rate of Ni concentration in the Pd coating, so that it is possible to measure the Ni concentration in the Pd coating by use of the SIMS.

In the semiconductor device lead frame of this embodiment, the Pd coating 2 is formed on the copper stock 1. However, the copper stock 1 may be replaced, for example, by a 42%Ni—Fe alloy stock, in which case similar effects can also be achieved. Further, although the Ni coating 3 is interposed between the copper stock 1 and the Pd coating 2, this Ni coating may be replaced, for example, by a Sn—Ni coating, in which case similar effects can be also achieved. Furthermore, although the Pd coating 2 is formed on the copper stock 1, the Pd coating 2 may be replaced by a Pd alloy (e.g. Pd—Ag) coating, in which case similar effects can be achieved.

According to the embodiments of the invention, the amount of impurity metal other than the Pd component or other than the Pd alloy components, which impurity metal is contained in the Pd coating or Pd alloy coating, is limited to not more than 1% in the case of Ni impurity or to not more than 0.06% in the case of Cu impurity. Thus, since the amount of the impurity, which is apt to become oxide due to thermal stress caused during the bonding of a semiconductor device such as a semiconductor chip, is limited to a lower level, it becomes possible to prevent the solder wettability of Pd or Pd alloy coating 2 from being deteriorated. Further, by providing an intermediate layer, a metal layer such as Ni layer other than the Pd or Pd alloy component between the Pd or Pd alloy coating 2 and the copper stock 1, it becomes possible to prevent the stock from being oxidized. Thus the deterioration of the solder wettability can be prevented.

As described above, according to the lead frame embodying the invention, the amount of impurity metal such as Ni other than Pd or Pd alloy constituents, which impurity metal forms an oxide because of a high-temperature thermal stress occurring during the bonding of the semiconductor device (e.g. the semiconductor chip), was reduced to a low level, thereby preventing the solder wettability of the Pd coating 2 or the Pd alloy coating from being lowered.

Further, in a case where a layer of metal (e.g. Ni) other than Pd or Pd alloy is interposed as an intermediate layer between the Pd coating 2 and the copper stock 1, the oxidation of the stock can be also prevented, thereby preventing the solder wettability from being lowered.

In the case of providing a primary coat between the plate-like stock and the Pd coating or the Pd alloy coating, there is also obtained an advantageous effect similar to the above effect.

Further, since the primary coat comprises the Ni coating, the oxidation of the stock is prevented, and this achieves an advantageous effect that the lowering of the solder wettability of the Pd coating or the Pd alloy coating is prevented.

Further, when the amount of impurity metal other than the Pd or alloy constituents, which impurity metal is contained in the Pd coating or in the Pd alloy coating, is not more than 2%, the amount of the impurity metal (which forms an oxide due to a high-temperature thermal stress occurring during the bonding of the semiconductor device) in the Pd coating or the Pd alloy coating is thus reduced to a lower level, thereby achieving an advantageous effect that the lowering of the solder wettability of the Pd coating or the Pd alloy coating is more positively prevented.

Further, when the primary coat is provided between the plate-like stock and the Pd coating or the Pd alloy coating, there is obtained an advantageous effect similar to the above effect.

Further, since the primary coat comprises the Ni coating, the oxidation of the stock is prevented, and this achieves an advantageous effect, in that the lowering of the solder wettability of the Pd coating or the Pd alloy coating is more positively prevented.

In the method of producing the semiconductor device lead frame according to the present invention, the amount of the impurity metal in the plating solution is reduced to a low level, thereby preventing the solder wettability of the Pd coating or the Pd alloy coating from being lowered, and therefore there is achieved an advantageous effect in that the lowering of the solder wettability due to the high-temperature thermal stress, occurring during the bonding of the semiconductor device, is prevented.

In another semiconductor device lead frame-producing method in which the Pd coating is formed on the plate-like stock through the primary coat by Pd plating, or the Pd alloy coating is formed on the plate-like stock through the primary coat by Pd alloy plating, there is achieved an advantageous effect similar to the above effect.

Further, since the primary coat comprises the Ni coating, the oxidation of the stock is prevented, and this achieves an advantageous effect in that the lowering of the solder wettability of the Pd coating or the Pd alloy coating is prevented.

Further, when the amount of impurity metal other than the Pd or the alloy constituents, which impurity metal is contained in the Pd plating solution or in the Pd alloy plating solution, is not more than 200 ppm, the amount of the impurity metal in the plating solution is thus reduced to a lower level, thereby achieving an advantageous effect in that the lowering of the solder wettability of the Pd coating or the Pd alloy coating is more positively prevented.

In the semiconductor device lead frame-producing method in which the Pd coating is formed on the plate-like stock through the primary coat by Pd plating, or the Pd alloy coating is formed on the plate-like stock through the primary coat by Pd alloy plating, there is achieved an advantageous effect similar to the above effect.

Further, since the primary coat comprises the Ni coating, the oxidation of the stock is prevented, and this achieves an advantageous effect in that the lowering of the solder wettability of the Pd coating or the Pd alloy coating is more positively prevented.

What is claimed is:

1. A lead frame for a semiconductor device, which lead frame has a good solderability, said lead frame consisting of:
    a sheet body consisting of a 42%Ni—Fe alloy, and
    a Pd coating provided on said sheet body, said Pd coating containing Ni, the Ni being present in an amount of not more than 2%, said coating being formed by the steps of preparing a Pd plating bath, and forming said Pd coating by plating said sheet body by use of said Pd plating bath while limiting a Ni concentration in said Pd plating bath to be not more than a predetermined value such that the amount of Ni contained in the plated Pd coating is not more than 2%.

2. The lead frame of claim 1, wherein the Ni is present in an amount not less than 0.52%.

3. A lead frame for a semiconductor device, which lead frame has a good solderability, said lead frame consisting of:
    a sheet body consisting of a material selected from the group consisting of copper and a 42%Ni—Fe alloy,
    a Ni primary coat disposed on said sheet body, and
    a Pd coating provided on said Ni primary coat, said Pd coating containing Ni, the Ni being present in an amount of not more than 2%, said coating being formed by the steps of preparing a Pd plating bath, and forming said Pd coating by plating said sheet body by use of said Pd plating bath while limiting a Ni concentration in said Pd plating bath to be not more than a predetermined value such that the amount of Ni contained in the plated Pd coating is not more than 2%.

4. The lead frame of claim 3, wherein the Ni is present in an amount not less than 0.52%.

5. A lead frame for a semiconductor device, which lead frame has a good solderability, said lead frame consisting of:
    a sheet body consisting of a 42%Ni—Fe alloy, and
    a Pd coating provided on said sheet body, said Pd coating containing Ni, the Ni being present in an amount of not more than 1%, said coating being formed by the steps of preparing a Pd plating bath, and forming said Pd coating by plating said sheet body by use of said Pd plating bath while limiting a Ni concentration in said Pd plating bath to be not more than a predetermined value such that the amount of Ni contained in the plated Pd coating is not more than 1%.

6. The lead frame of claim 5, wherein the Ni is present in an amount not less than 0.52%.

7. A lead frame for a semiconductor device, which lead frame has a good solderability, said lead frame consisting of:
    a sheet body consisting of a material selected from the group consisting of copper and a 42%Ni—Fe alloy,
    a Ni primary coat disposed on said sheet body, and
    a Pd coating provided on said Ni primary coat, said Pd coating containing Ni, the Ni being present in an amount of not more than 1%, said coating being formed by the steps of preparing a Pd plating bath, and forming said Pd coating by plating said sheet body by use of said Pd plating bath while limiting a Ni concentration in said Pd plating bath to be not more than a predetermined value such that the amount of Ni contained in the plated Pd coating is not more than 1%.

8. The lead frame of claim 7, wherein the Ni is present in an amount not less than 0.52%.

9. A lead frame for a semiconductor device, which lead frame has a good solderability, said lead frame consisting of:
    a sheet body consisting of copper, and
    a Pd coating provided on said sheet body, said Pd coating containing Cu, the Cu being present in an amount of not more than 0.12%, said coating being formed by the steps of preparing a Pd plating bath, and forming said Pd coating by plating said sheet body by use of said Pd plating bath while limiting a Cu concentration in said Pd plating bath to be not more than a predetermined value such that the amount of Cu contained in the plated Pd coating is not more than 0.12%.

10. The lead frame of claim 9, wherein the Cu is present in an amount of not less than 0.03%.

11. A lead frame for a semiconductor device, which lead frame has a good solderability, said lead frame consisting of:
   a sheet body,
   a Ni primary coat disposed on said sheet body, and
   a Pd coating provided on said Ni primary coat, said Pd coating containing Ni, the Ni being present in an amount of not more than 0.12%, said coating being formed by the steps of preparing a Pd plating bath, and forming said Pd coating by plating said sheet body by use of said Pd plating bath while limiting a Ni concentration in said Pd plating bath to be not more than a predetermined value such that the amount of Ni contained in the plated Pd coating is not more than 0.12%.

12. A lead frame for a semiconductor device, which lead frame has a good solderability, said lead frame consisting of:
   a sheet body consisting of copper, and
   a Pd coating provided on said sheet body, said Pd coating containing Cu, the Cu being present in an amount of not more than 0.06%, said coating being formed by the steps of preparing a Pd plating bath, and forming said Pd plating by plating said sheet body by use of said Pd plating bath while limiting a Cu concentration in said Pd plating bath to be not more than a predetermined value such that the amount of Cu contained in the plated Pd coating is not more than 0.06%.

13. The lead frame of claim 12, wherein the Cu is present in an amount of not less than 0.03%.

* * * * *